United States Patent
Ito et al.

(10) Patent No.: US 12,328,825 B2
(45) Date of Patent: Jun. 10, 2025

(54) ANALYSIS DEVICE FOR A COMPONENT MOUNTING DEVICE TO ANALYZE BOARD CONTACT OF A COMPONENT

(71) Applicant: FUJI CORPORATION, Chiryu (JP)

(72) Inventors: Hidetoshi Ito, Okazaki (JP); Koji Okada, Anjo (JP)

(73) Assignee: FUJI CORPORATION, Chiryu (JP)

( * ) Notice: Subject to any disclaimer, the term of this patent is extended or adjusted under 35 U.S.C. 154(b) by 918 days.

(21) Appl. No.: 17/438,622

(22) PCT Filed: Mar. 27, 2019

(86) PCT No.: PCT/JP2019/013158
§ 371 (c)(1),
(2) Date: Sep. 13, 2021

(87) PCT Pub. No.: WO2020/194571
PCT Pub. Date: Oct. 1, 2020

(65) Prior Publication Data
US 2022/0142025 A1 May 5, 2022

(51) Int. Cl.
*G05B 19/4097* (2006.01)
*H05K 13/04* (2006.01)
*H05K 13/08* (2006.01)

(52) U.S. Cl.
CPC ....... *H05K 13/082* (2018.08); *G05B 19/4097* (2013.01); *H05K 13/0411* (2018.08); *G05B 2219/35059* (2013.01)

(58) Field of Classification Search
CPC ............. H05K 13/082; H05K 13/0411; H05K 13/0815; H05K 13/041; G05B 19/4097; G05B 2219/35059
See application file for complete search history.

(56) References Cited

U.S. PATENT DOCUMENTS

| | | | | |
|---|---|---|---|---|
| 5,509,193 A | * | 4/1996 | Nuxoll | H05K 13/0406 29/760 |
| 6,971,161 B1 | * | 12/2005 | Maenishi | H05K 13/08 700/121 |

(Continued)

FOREIGN PATENT DOCUMENTS

| JP | H053399 A | * | 1/1993 |
|---|---|---|---|
| JP | 7-38279 A | | 2/1995 |

(Continued)

OTHER PUBLICATIONS

Sugita, Translation for WO2017033325A1 retrieved from Google Patents. (Year: 2017).*

(Continued)

*Primary Examiner* — Robert E Fennema
*Assistant Examiner* — Marzia T Monty
(74) *Attorney, Agent, or Firm* — Oblon, McClelland, Maier & Neustadt, L.L.P.

(57) ABSTRACT

An analysis device is a device for use for a component mounting device including a pickup member configured to be moved relative to a board by means of a moving device and a contact detection sensor configured to detect that a component picked up by the pickup member is brought into contact with the board to analyze a mounting state of the component mounting device. The analysis device includes a storage device configured to store multiple detection result data relating to detection results obtained by the contact detection sensor when the component is mounted on the board in association with mounting conditions when the detection results are obtained by the contact detection sensor, and an output device configured to count the multiple detection result data stored in the storage device by at least two conditions in the mounting conditions and output the multiple detection result data so counted.

7 Claims, 11 Drawing Sheets

(56) References Cited

U.S. PATENT DOCUMENTS

2016/0255755 A1* 9/2016 Iisaka .................. H05K 13/08
                                                                                           29/739
2020/0068759 A1* 2/2020 Cvijetinovic ...... H05K 13/0895

FOREIGN PATENT DOCUMENTS

| JP | 2001-28497 A | 1/2001 | |
|---|---|---|---|
| JP | 2003-69292 A | 3/2003 | |
| JP | WO2015059754 A1 * | 3/2017 | |
| JP | WO 2018/154761 A1 | 8/2018 | |
| JP | 2019-36574 A | 3/2019 | |
| WO | WO-2017033325 A1 * | 3/2017 | ........... G05B 19/401 |
| WO | WO 2018/011907 A1 | 1/2018 | |

OTHER PUBLICATIONS

Translation of Ryuhei Kamio (JPWO2015059754A1) (Year: 2017).*
Translation of Takada Kazunori (JPH053399A) (Year: 1993).*
International Search Report mailed on Jun. 25, 2019 in PCT/JP2019/013158 filed on Mar. 27, 2019 (2 pages).

\* cited by examiner

| MOUNTING NUMBER | TOUCH DETECTION NUMBER | TOUCH NON-DETECTION NUMBER |
|---|---|---|
| 1000 | 980 | 20 |

| HOLDER IN USE | MOUNTING NUMBER | TOUCH DETECTION NUMBER | TOUCH NON-DETECTION NUMBER |
|---|---|---|---|
| 1 | 100 | 100 | 0 |
| 2 | 100 | 100 | 0 |
| 3 | 200 | 195 | 5 |
| 4 | 200 | 200 | 0 |
| ⋮ | ⋮ | ⋮ | ⋮ |

Fig. 8

| COMPONENT REFERENCE | MOUNTING COORDINATE | MOUNTING NUMBER | TOUCH DETECTION NUMBER | TOUCH NON-DETECTION NUMBER |
|---|---|---|---|---|
| A0001 | (1,1) | 100 | 100 | 0 |
| A0002 | (10,5) | 100 | 100 | 0 |
| B0001 | (20,4) | 100 | 95 | 5 |
| B0002 | (32,20) | 100 | 98 | 2 |
| ⋮ | ⋮ | ⋮ | ⋮ | ⋮ |

Fig. 9

| PICKUP SLOT | MOUNTING NUMBER | TOUCH DETECTION NUMBER | TOUCH NON-DETECTION NUMBER |
|---|---|---|---|
| 11 | 50 | 50 | 0 |
| 12 | 50 | 50 | 0 |
| 14 | 100 | 95 | 5 |
| 15 | 100 | 100 | 0 |
| ⋮ | ⋮ | ⋮ | ⋮ |

Fig. 10

| COMPONENT TYPE | MOUNTING NUMBER | TOUCH DETECTION NUMBER | TOUCH NON-DETECTION NUMBER |
|---|---|---|---|
| 1 | 100 | 95 | 5 |
| 2 | 100 | 100 | 0 |
| 3 | 200 | 190 | 10 |
| 4 | 200 | 100 | 0 |
| ⋮ | ⋮ | ⋮ | ⋮ |

| Z-Axis IN USE | | MOUNTING NUMBER | TOUCH DETECTION NUMBER | TOUCH NON-DETECTION NUMBER |
| --- | --- | --- | --- | --- |
| FOR PICKUP | FOR MOUNTING | | | |
| Z1 | Z1 | 400 | 380 | 20 |
| Z1 | Z2 | 200 | 200 | 0 |
| Z2 | Z1 | 200 | 200 | 0 |
| Z2 | Z2 | 200 | 200 | 0 |

ANALYSIS DEVICE FOR A COMPONENT MOUNTING DEVICE TO ANALYZE BOARD CONTACT OF A COMPONENT

TECHNICAL FIELD

The present description discloses an analysis device for analyzing a state of a component mounting device.

BACKGROUND ART

Conventionally, in component mounting devices for mounting a component on a board, there has been proposed a component mounting device including a contact switch (a contact detection sensor) for detecting that a component is brought into abutment with a surface of a board (refer, for example, to Patent Literature 1). This component mounting device is such that a coordinate point of a height above a work target location on a work target surface (a front surface) of a board is detected by detecting a timing at which a chip component is brought into abutment with the work target surface by means of the contact switch.

Patent Literature

Patent Literature 1: JP-A-2003-69292

BRIEF SUMMARY

Technical Problem

Incidentally, a mounting state of a component mounted on a board can be inspected by imaging the board on which the component is mounted by means of an imaging device and recognizing the captured image that is so obtained. With this inspection method, however, although the fact that the component is mounted on the board can be inspected, whether the component is pushed into the board with a proper load cannot be inspected. That is, with this inspection method, it is difficult to accurately determine on a mounting failure of a component. In addition, when a mounting failure of a component occurs, it is also necessary to find out a cause for the mounting failure of the component by analyzing the state of the component mounting device then.

A main object of the present disclosure is to provide an analysis device capable of easily analyzing a mounting state of a component mounting device.

Solution to Problem

The present disclosure adopts the following means to achieve the main object described above.

According to the gist of a first aspect of the present disclosure, there is provided an analysis device for use for a component mounting device including a pickup member configured to be moved relative to a board by means of a moving device and a contact detection sensor configured to detect that a component picked up by the pickup member is brought into contact with the board to analyze a mounting state of the component mounting device, the analysis device including:

a storage device configured to store multiple detection result data relating to detection results obtained by the contact detection sensor when the component is mounted on the board in association with mounting conditions when the detection results are obtained by the contact detection sensor; and an output device configured to count the multiple detection result data stored in the storage device by at least two conditions in the mounting conditions and output the multiple detection result data so counted.

With the analysis device according to the first aspect of the present disclosure, the multiple detection result data relating to the detection results obtained by the contact detection sensor when the component is mounted on the board are stored in association with the mounting conditions when the detection data are obtained. Then, the analysis device counts the stored multiple detection data by the at least two conditions in the mounting conditions and outputs the detection result data so counted. As a result, the mounting states of the component mounting device can easily be analyzed based on the detection result data collected and combined by the at least two conditions. For example, when a component mounting failure occurs, the mounting states of the component mounting device can be analyzed to locate the mounting condition in which the component mounting failure occurs, thereby making it possible to improve the component mounting quality of the component mounting device by reflecting the results of the analysis to the mounting of a component by the component mounting device.

According to the gist of a second aspect of the present disclosure, there is provided an analysis device for use for a component mounting system including multiple component mounting devices each having a pickup member configured to be moved relative to a board by means of a moving device and a contact detection sensor configured to detect that a component picked up by the pickup member is brought into contact with the board to analyze a mounting state of each of the component mounting devices, the analysis device including: a storage device configured to store multiple detection result data relating to detection results obtained by the contact detection sensor when the component is mounted on the board for each of the component mounting devices; and an output device configured to count the multiple detection result data stored in the storage device and output the multiple detection result data so counted for each of the component mounting devices.

With the analysis device according to the second aspect of the present disclosure, the multiple detection result data relating to the detection results obtained by the contact detection sensor when the component is mounted on the board are stored for each of the component mounting devices that make up the component mounting system. Then, the analysis device counts the multiple detection result data stored therein and outputs the detection results so counted for each of the component mounting devices. As a result, the mounting states of each of the component mounting devices can easily be analyzed based on the detection result data. For example, when a component mounting failure occurs, the mounting states of each of the component mounting devices can be analyzed to locate the component mounting device in which the component mounting failure occurs, thereby making it possible to improve the component mounting quality of the component mounting system by reflecting the results of the analysis to the mounting of a component by the component mounting device in which the component mounting failure occurs.

BRIEF DESCRIPTION OF DRAWINGS

FIG. 8 is an explanatory diagram showing an example of detection result data by component reference.

FIG. 9 is an explanatory diagram showing an example of detection result data by pickup slot.

FIG. 10 is an explanatory diagram showing an example of detection result data by component type.

DESCRIPTION OF EMBODIMENTS

Figure 1:
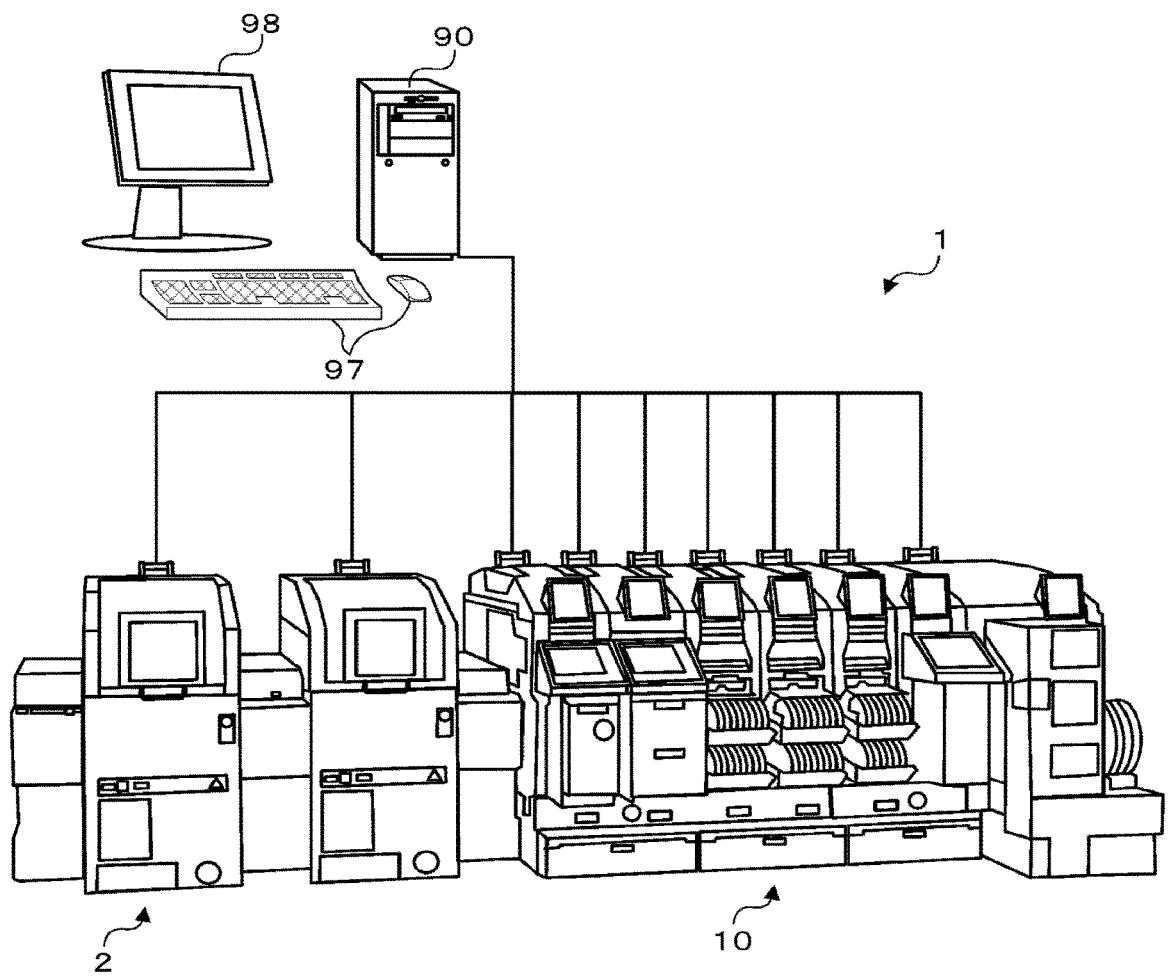
FIG. 1 is a schematic configuration view of component mounting system 1.
Figure 2:
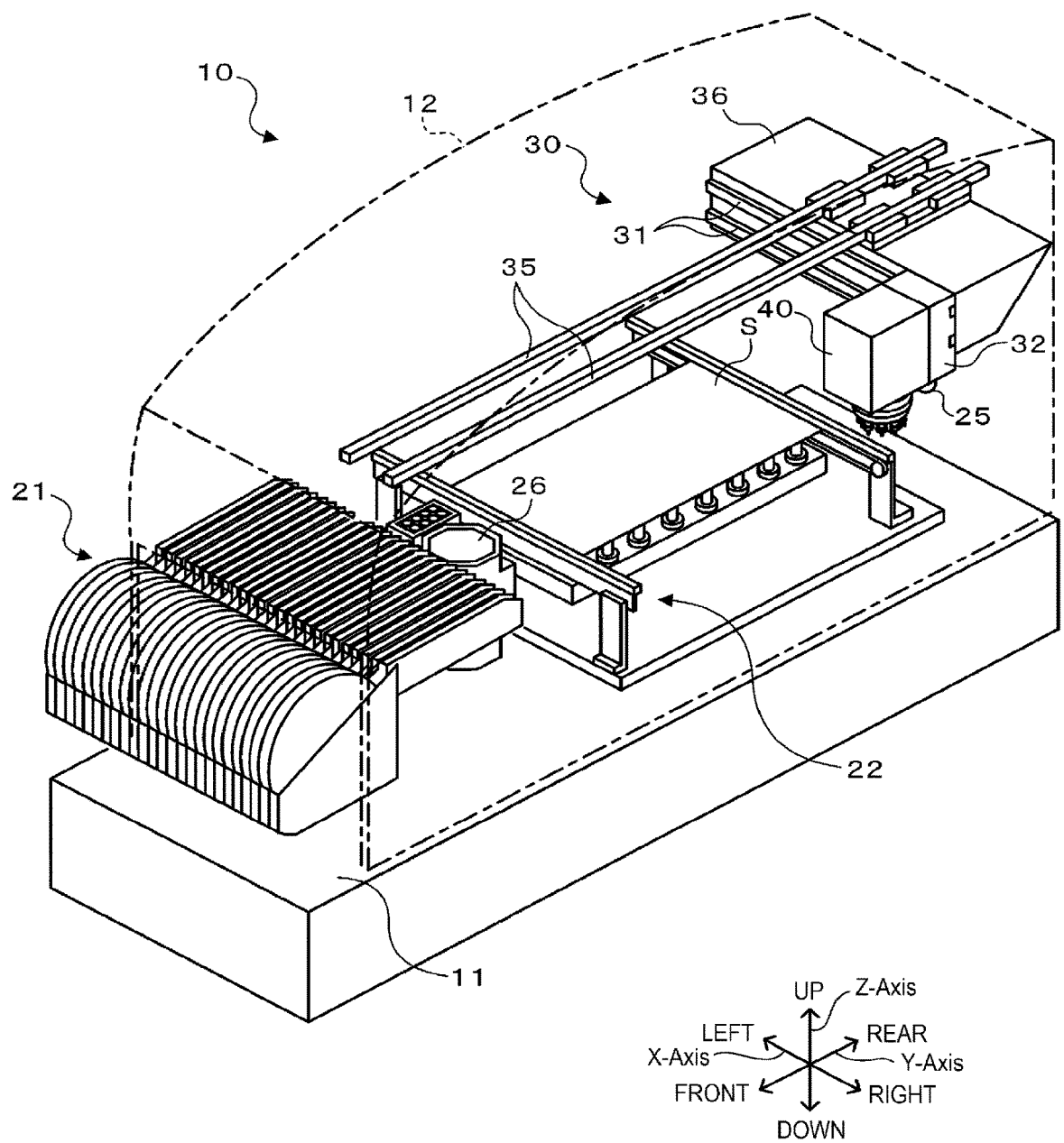
FIG. 2 is a schematic configuration view of component mounting device 10.
Figure 3:
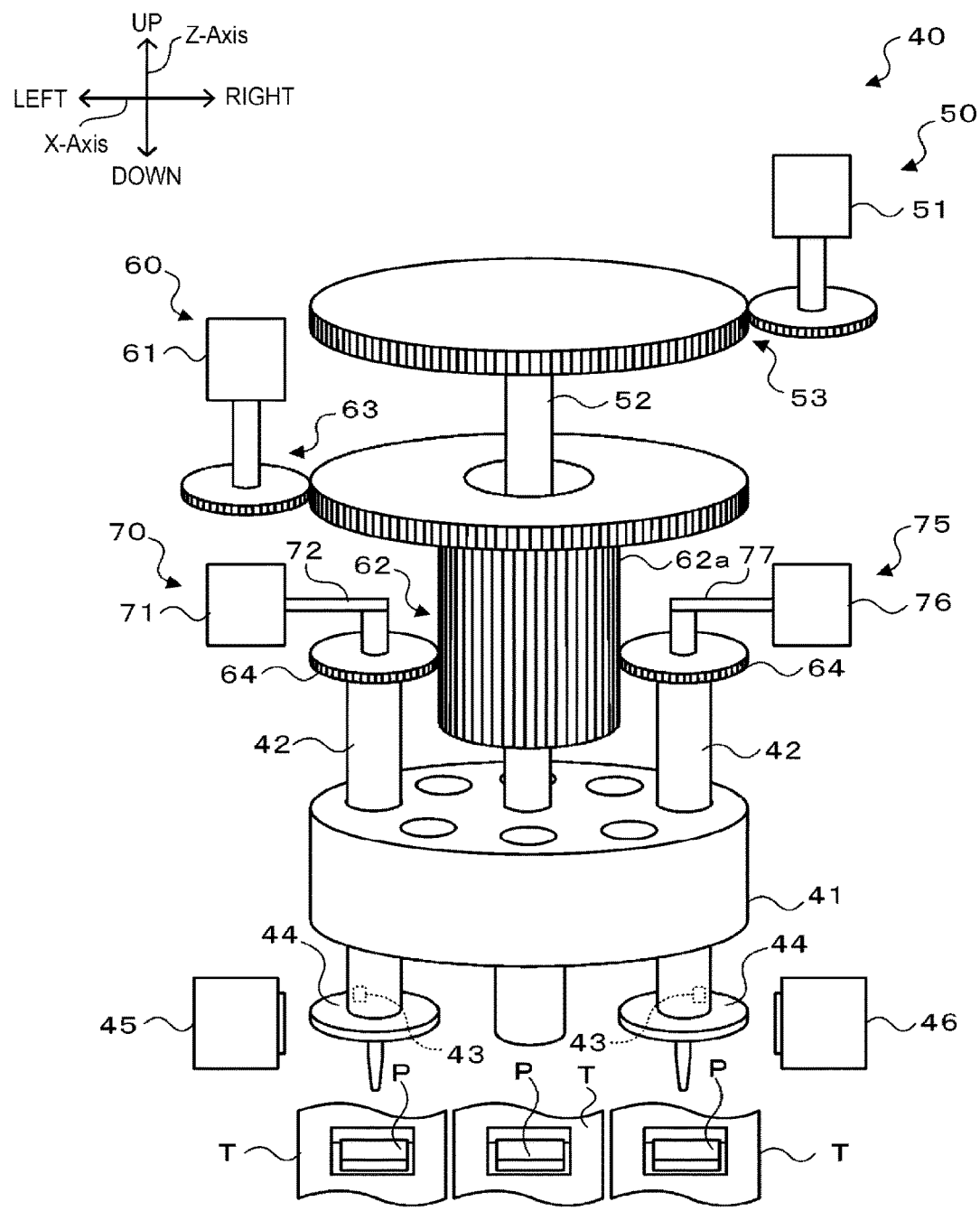
FIG. 3 is a schematic configuration view of head 40.
Figure 4:
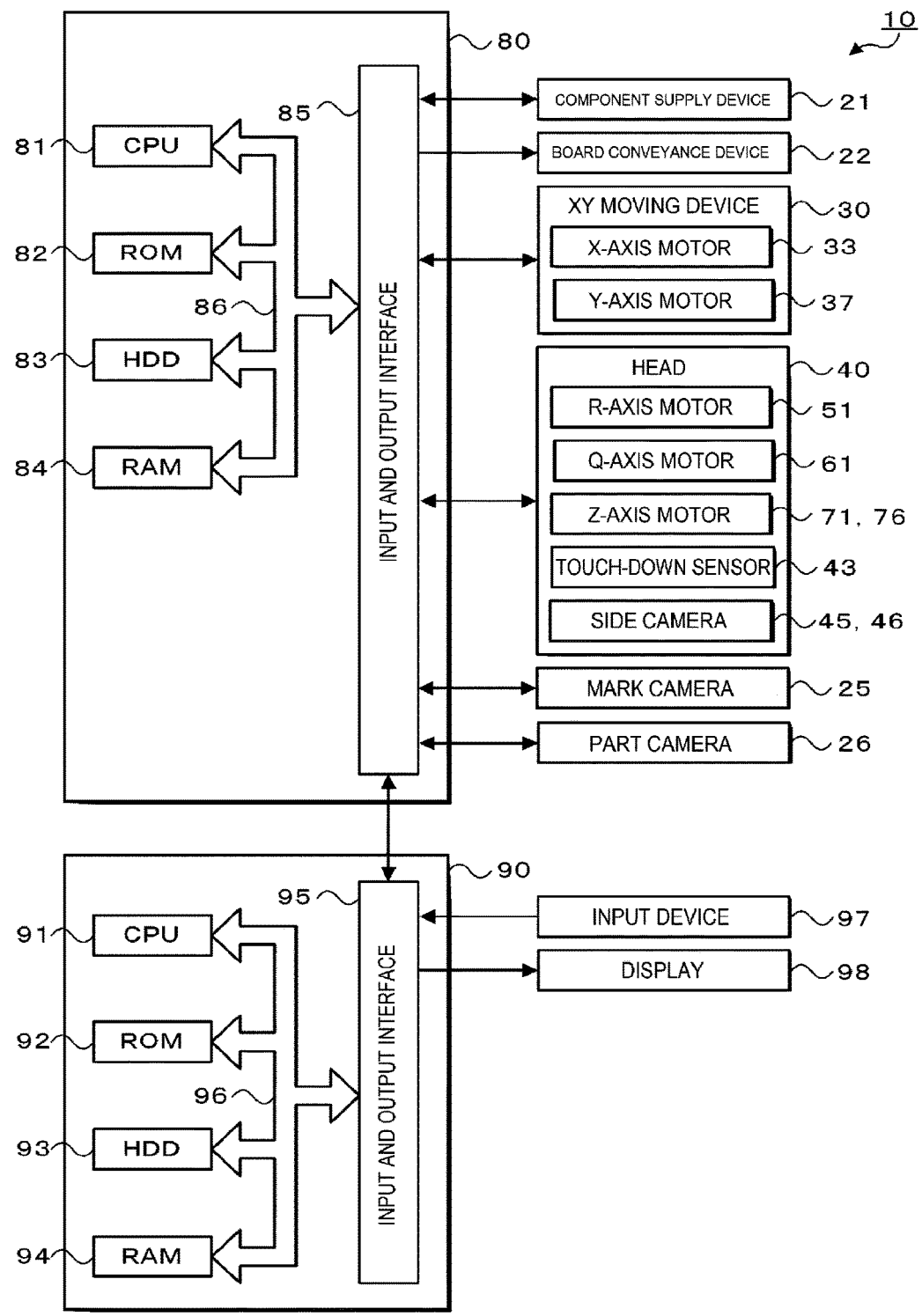
FIG. 4 is a block diagram showing an electrical connection relationship in component mounting device 10.

FIG. 1 is a schematic configuration view of component mounting system 1. FIG. 2 is a schematic configuration view of component mounting device 10. FIG. 3 is a schematic configuration view of head 40. FIG. 4 is a block diagram showing an electrical connection relationship in component mounting device 10. In FIG. 2, a left-right direction constitutes an X-axis direction, a front-rear direction constitutes a Y-axis direction, and an up-down direction constitutes a Z-axis direction.

As shown in FIG. 1, component mounting system 1 includes one or multiple screen printing machines 2, multiple component mounting devices 10, and management device 90 for managing the whole of component mounting system 1.

As shown in FIG. 2, component mounting device 10 includes component supply device 21, board conveyance device 22, XY moving device 30, head 40, and control device 80 (refer to FIG. 4). These are disposed within housing 12 supported on base 11. In addition, as shown in FIG. 1, multiple component mounting devices 10 are disposed in a board conveyance direction so as to constitute a component mounting line.

Component supply device 21 is configured as a tape feeder including a reel around which tape T is wound. This component supply device 21 is detachably attached to each of multiple feeder bases (not shown), which are aligned in the left-right direction (the X-axis direction) at a front side of base 11. Multiple components are held onto tape T at equal intervals along a longitudinal direction of tape T. Tape T is unwound from the reel toward the rear, and is fed to a component supply position in such a state that components P are exposed. Components P supplied to the component supply position are picked up (picked up through suction) by suction nozzle 44 of head 40.

Board conveyance device 22 is designed to convey in, fix, and convey out board S in the left-right direction (the X-axis direction). Board conveyance device 22 has a pair of conveyor belts that is provided in such a manner as to be spaced apart in the front-rear direction and is stretched in the left-right direction in FIG. 1. Board S is conveyed by these conveyor belts.

XY moving device 30 is designed to move head 40 over an XY-plane that follows a front surface of board S. As shown in FIG. 2, this XY moving device 30 includes X-axis slider 32 and Y-axis slider 36. In addition, although not shown, XY moving device 30 also additionally includes an X-axis position sensor for detecting a position of X-axis slider 32 in the X-axis direction and a Y-axis position sensor for detecting a position of Y-axis slider 36 in the Y-axis direction. X-axis slider 32 is supported by pair of upper and lower X-axis guide rails 31 provided on a front surface of Y-axis slider 36 in such a manner as to extend in the left-right direction. X-axis slider 32 can move in the left-right direction, that is, the X-axis direction by driving X-axis motor 33 (refer to FIG. 4). Y-axis slider 36 is supported by pair of left and right Y-axis guide rails 35 provided at an upper stage portion of housing 12 in such a manner as to extend in the front-rear direction. Y-axis slider 36 can move in the front-rear direction, that is, the Y-axis direction by driving Y-axis motor 37 (refer to FIG. 4). Head 40 is attached to X-axis slider 32. Accordingly, head 40 can be moved in XY-directions by XY moving device 30.

Head 40 picks up (picks up through suction) component P supplied from component supply device 21 with suction nozzle 44 and mounts component P so picked up onto board S fixed in place on board conveyance device 22. As shown in FIG. 3, this head 40 includes head main body 41, nozzle holders 42, touch-down sensors 43, suction nozzles 44, side cameras 45, 46, R-axis driving device 50, Q-axis driving device 60, first Z-axis driving device 70, and second Z-axis driving device 75. Here, board S includes a board to which a solder, an adhesive, a component, and the like are added.

Head main body 41 is a rotating body that can be rotated by R-axis driving device 50. Nozzle holders 42 are provided in head main body 41 in such a manner as to be arranged at predetermined angular intervals in a circumferential direction and are supported in such a manner as to be freely lifted up and lowered through head main body 41. Suction nozzle 44 is detachably attached to a distal end portion of nozzle holder 42. Suction nozzle 44 picks up component P by virtue of a negative pressure supplied by a pressure supply device (not shown), and releases component P so picked up by virtue of a positive pressure supplied by the pressure supply device. Although not shown, the pressure supply device includes a negative pressure source, a positive pressure source, and a selector or switching valve that can switch a pressure supplied to a suction port of each suction nozzle 44 among a negative pressure, a positive pressure, and the atmospheric pressure. In addition, suction nozzle 44 can move in the Z-axis direction (the up-down direction in FIG. 4) relative to nozzle holder 42 in such a state that suction nozzle 44 is attached to nozzle holder 42 and is biased downwards by means of a spring, not shown. The spring contracts when component P picked up by and held to suction nozzle 44 is brought into abutment with board S as a result of nozzle holder 42 and suction nozzle 44 moving relative to each other to thereby alleviate an impact applied to component P in question. In addition, nozzle holder 42 includes touch-down sensor 43 provided therein to detect that component P picked up by and held to suction nozzle 44 is pushed into board S when that component P is mounted on board S. This touch-down sensor 43 is configured as, for example, a contact switch or an optical switch that is turned on from off or turned off from on when nozzle holder 42 and suction nozzle 44 move relative to each other to the accompaniment of the contraction of the spring.

R-axis driving device 50 causes multiple nozzle holders 42 (multiple suction nozzles 44) to revolve (turn in circle) around a center axis of head main body 41 along a circumferential direction. As shown in FIG. 3, R-axis driving device 50 includes R-axis motor 51, R-shaft 52 extending in an axial direction from the center axis of head main body 41, and transmission gears 53 for transmitting the rotation of R-axis motor 51 to R-axis shaft 52. In addition to these constituent elements, R-axis driving device 50 also includes an R-axis position sensor, not shown, that is configured to detect a rotational position of R-axis motor 51. R-axis driving device 50 causes head main body 41 to rotate by causing R-axis motor 51 to rotationally drive R-axis shaft 52 by way of transmission gears 53. Each nozzle holder 42 revolves (turns in circle) in the circumferential direction together with corresponding suction nozzle 44 as a result of the rotation of head main body 41.

Q-axis driving device 60 causes each nozzle holder 42 (each suction nozzle 44) to rotate (spin) around its own center axis. As shown in FIG. 3, Q-axis driving device 60 includes Q-axis motor 61, cylindrical member 62, transmission gear 63, and Q-axis gears 64. Cylindrical member 62 is passed over R-axis shaft 52 coaxially and relatively rotatably, and spur gears 62a are formed on an outer peripheral surface of cylindrical member 62. Transmission gears 63 transmit the rotation of Q-axis motor 61 to cylindrical member 62. Each Q-axis gear 64 is provided above corresponding nozzle holder 42 and slidably meshes with spur gear 62a of cylindrical member 62 in the Z-axis direction (the up-down direction). In addition to these constituent elements, Q-axis driving device 60 also includes a Q-axis position sensor, not shown, that is configured to detect a rotational position of Q-axis motor 61. Q-axis driving device 60 can collectively rotate both Q-axis gears 64 meshing with spur gears 62a of cylindrical member 62 by causing Q-axis motor 61 to rotationally drive cylindrical member 62 by way of transmission gear 63. Each nozzle holder 42 rotates (spins) about its own center axis together with corresponding suction nozzle 44 by virtue of the rotation of corresponding Q-axis gear 64.

First and second Z-axis driving devices 70, 75 are configured to individually and separately lift up and lower corresponding nozzle holder 42 at two locations on a revolving (circular turning) track of nozzle holders 42. In the present embodiment, first and second Z-axis driving devices 70, 75 are provided in such a manner as to be aligned along the aligning direction (the X-axis direction) of component supply devices 21 (the tape feeders).

As shown in FIG. 3, first and second Z-axis driving devices 70, 75 include corresponding Z-axis sliders 72, 77, and corresponding Z-axis motors 71, 76 for lifting up and lowering corresponding Z-axis sliders 72, 77. In addition to these constituent elements, although not shown, first and second Z-axis driving devices 70, 75 also include Z-axis position sensors for detecting lifting and lowering positions of Z-axis sliders 72, 77. First and second Z-axis driving devices 70, 75 lift up or lower corresponding Z-axis sliders 72, 77 by driving corresponding Z-axis motors 71, 76 to thereby bring Z-axis sliders 72, 77 into abutment with corresponding nozzle holders 42 lying below Z-axis sliders 72, 77, so that nozzle holders 42 are caused to be lifted up or lowered together with corresponding suction nozzles 44. First and second Z-axis driving devices 70, 75 may use linear motors as Z-axis motors 71, 76 to lift up and lower Z-axis sliders 72, 77, or may use rotation motors and feed screw mechanisms to lift up and lower Z-axis sliders 72, 77. In addition, first and second Z-axis driving devices 70, 75 may be configured to lift up and lower corresponding Z-axis sliders 72, 77 by use of actuators such as air cylinders in place of Z-axis motors 71, 76. In this way, head 40 of the present embodiment includes two Z-axis driving devices 70, 75 for lifting up and lowering corresponding nozzle holders 42 (corresponding suction nozzles 44) individually and separately, whereby pickup operations of components P by corresponding suction nozzles 44 can be executed individually and separately by use of those two Z-axis driving devices 70, 75. As a result, with this head 40, by supplying two components P from component supply device 21 while disposing them at a similar interval to that at which two suction nozzles 44, which can be lifted up and lowered by two Z-axis driving devices 70, 75, are disposed, those two components P can be picked up at substantially the same time by lowering those two suction nozzles 44 at substantially the same time.

Side cameras 45, 46 image areas of corresponding suction nozzles 44 which lie near distal end portions thereof from a side for determination on whether suction nozzles 44 individually pick up corresponding components properly or suction orientations thereof after suction nozzles 44 have executed pickup operations. In the present embodiment, side camera 45 is disposed so as to image the area of corresponding suction nozzle 44 which lies near the distal end portion thereof after suction nozzle 44 in question is lowered by first Z-axis driving device 70 to execute its pickup operation. In addition, side camera 48 is disposed so as to image the area of suction nozzle 44 which lies near the distal end portion thereof after suction nozzle 44 in question is lowered by second Z-axis driving device 75 to execute its pickup operation.

Mark camera 25 images an upper surface of board S from above that is conveyed in by board conveyance device 22 or images an upper surface of component P from above that is supplied by component supply device 21. Mark camera 25 is provided on head 40 or X-axis slider 32 and can be moved in the XY-directions by XY moving device 30. Mark camera 25 images a reference mark affixed to substrate S to be used to locate a position of board S, and outputs an image of the reference mark so imaged to control device 80. Mark camera 25 images the upper surface of component P, and outputs an image of the upper surface of component P so imaged to control device 80.

Part camera 26 is disposed on base 11 in a position lying between board conveyance device 22 and component supply device 21. Part camera 26 images a component picked up by and held to suction nozzle 44 from below when that suction nozzle 44 so holding the component passes over part camera 26 and outputs an image of the component so imaged to control device 80.

As shown in FIG. 4, control device 80 is configured as a microprocessor that is made up mainly of CPU 81, and includes ROM 82 for storing process programs, HDD 83 as an external storage device for storing various types of data, RAM 84 used as a work region, input and output interface 85 for exchanging electric signals with external devices, and the like. These constituent elements are connected to one another via bus 86. The external storage device is not limited to HDD 83, and hence, SSD may be used. Control device 80 outputs control signals to component supply device 21, board conveyance device 22, head 40 (R-axis motor 51, Q-axis motor 61, Z-axis motors 71, 76, and side cameras 45, 46), mark camera 25, and part camera 26. Control device 80 receives signals inputted from head 40 (side cameras 45, 46), component supply device 21, mark camera 25, and part camera 26.

As shown in FIG. 4, management device 90 is configured as a microprocessor that is made up mainly of CPU 91, and includes ROM 92 for storing process programs, HDD 93 as an external storage device for storing various types of data, RAM 94 used as a work region, input and output interface 95 for exchanging electric signals with the external devices, and the like. These constituent elements are connected together via bus 96. The external storage device is not limited to HDD 93, and hence, SSD may be used. Input device 97 such as a keyboard, a mouse or the like through which an operator inputs various types of commands and display 98 for displaying various pieces of information are connected to management device 90. HDD 93 stores job information including a production program and other production information. Here, the production program means a program that specifies which component is to be mounted on which board S in which order and how many boards so mounted are to be manufactured in component mounting device 10. The production information defines mounting conditions for picking up component P supplied from component supply device 21 and mounting component P so picked up on board S, and is determined for each mounting target component P. The production information (mounting conditions) includes types of mounting target components P (by component type) and size thereof, reference information that is individually assigned to mounting target components P (by component reference), identification information on heads for use (by head in use), identification information on holders for use (by holder in use), identification information on feeder bases where component supply devices 21 accommodating therein mounting target components P are mounted (by pickup slot), identification information on Z-axis driving devices for use in picking up and mounting the mounting target components P (by Z-axis in use), target mounting positions (by XY-coordinate), target mounting height (by Z-coordinate), and the like. Management device 90 is communicably connected to control device 80 of component mounting device 10, and exchanges various types of information and control signals. Management device 90 is configured as an analysis device of the present disclosure.

Next, operations (component pickup process and component mounting process) of component mounting device 10 that is configured in the way described heretofore will be described. A component pickup process is executed when job information is received from management device 90 and board S is conveyed into component mounting device 10 and is fixed in place therein by board conveyance device 22. In the component pickup process, CPU 81 of control device 80 causes XY moving device 30 to move head 40 so that suction nozzle 44 held by a holder in use arrives over a supply position (an XY-coordinate) of a mounting target component that is specified from a pickup slot. Next, CPU 81 causes the Z-axis driving device corresponding to the Z-axis in use so that a distal end portion of suction nozzle 44 held by the holder in use arrives at a supply height (a Z-coordinate) of a mounting target component and then causes the holder in use to be lowered. Then, CPU 81 causes a negative pressure to be applied to suction nozzle 44 held by the holder in use so that component P is picked up by this suction nozzle 44. If there remains in the multiple suction nozzles of head 40 an idle or empty nozzle that is expected to pick up component P, CPU 81 repeatedly executes the component pickup process described above.

Then, when component P is picked up by suction nozzle 44 in this way, CPU 81 proceeds to a component mounting process. In the component mounting process, CPU 81 causes XY moving device 30 to move head 40 so that component P picked up by and held to suction nozzle 44 arrives above part camera 26. Subsequently, CPU 81 causes part camera 26 to image component P that has arrived thereabove. Next, CPU 81 processes an image of component P so obtained to derive a positional deviation amount of a pickup position of that component P, and then corrects a target mounting position (an XY-coordinate) on board S based on the derived positional deviation amount. Then, CPU 81 causes XY moving device 30 to move head 40 so that component P picked up by and held to suction nozzle 44 arrives above the target mounting position (the XY-coordinate). Next, CPU 81 causes the Z-axis driving device corresponding to the Z-axis in use to lower the holder in use so that component P picked up by and held to suction nozzle 44 arrives at a target mounting height (a Z-coordinate). Then, CPU 81 causes a positive pressure to be applied to suction nozzle 44 holding component P so that component P held by suction nozzle 44 is mounted on board S. If there remains in the multiple suction nozzles of head 40 a nozzle that is scheduled to mount component P on board S, CPU 81 repeatedly executes the component mounting process described above.

Figures 5, 6, 7:
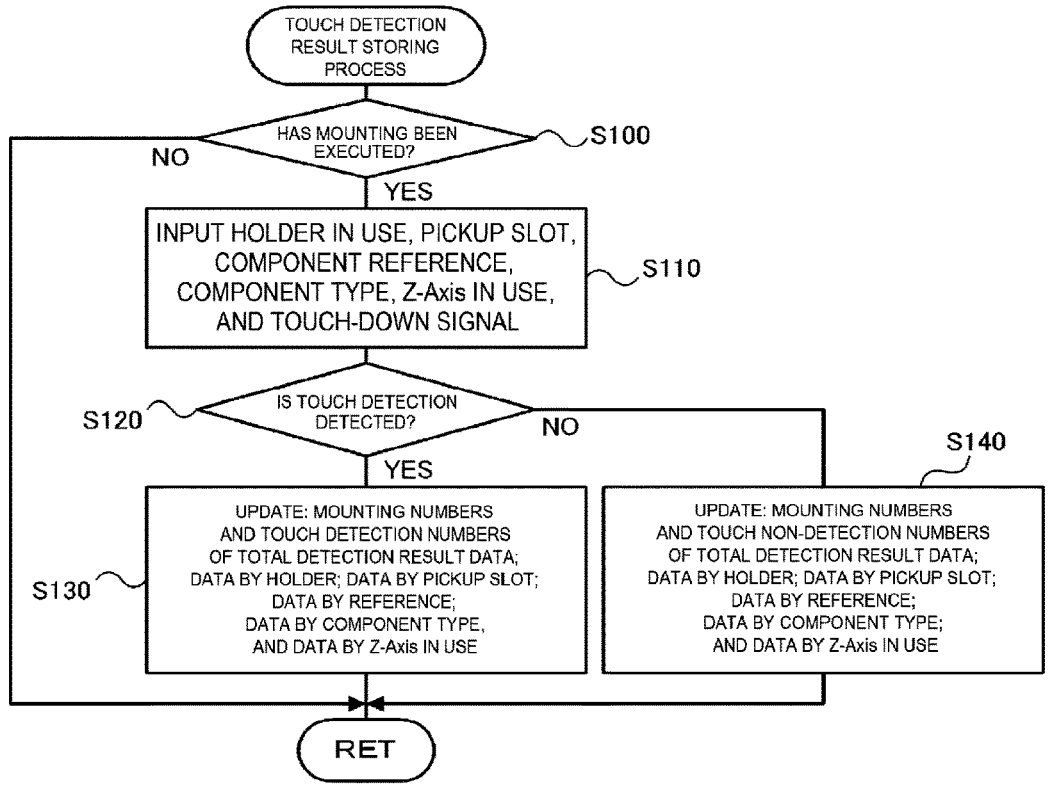
FIG. 5 is a flowchart showing an example of a touch detection result storing process.
FIG. 6 is an explanatory diagram showing an example of total detection result data.
FIG. 7 is an explanatory diagram showing an example of detection result data by holder.

Next, operations executed by management device 90 (the analysis device) will be described. In particular, an operation will be described of inspecting whether component P is pushed into board S appropriately in mounting component P on board S. FIG. 5 is a flowchart showing an example of touch detection result storing process executed by CPU 91 of management device 90. The touch detection result storing process is repeatedly executed every predetermined time period (e.g., every several tens of msec).

In the touch detection result storing process, CPU 91 of management device 90 first determines whether mounting of component P (the component mounting process) has been executed (step S100). If it determines that no mounting of component P has been executed, CPU 91 ends the touch detection result storing process as it is. On the other hand, if it determines that the mounting of component P has been executed, CPU 91 inputs a holder in use, a pickup slot, a component reference, a component type, and a Z-axis in use as mounting conditions used for the mounting of component P and also inputs a signal from touch-down sensor 43 (step S110). Then, CPU 91 determines whether pushing of component P into board S (a touch down) is detected by touch-down sensor 43 in mounting component P on board S based on the signal so inputted (step S120). If it determines that the pushing of component P into board S is detected, CPU 91 updates total detection result data, detection result data by holder, detection result data by pickup slot, detection result data by reference, detection result data by component type, and detection result data by Z-axis in use by incrementing mounting numbers and touch detection numbers of the individual pieces of detection result data only by a value 1 (step S130), and ends the touch detection result storing process. On the other hand, if it determines that no pushing of component P into board S has been detected, CPU 91 updates the individual piece of detection result data by incrementing the mounting numbers and touch non-detection numbers thereof only by a value 1 (step S140), and ends the touch detection result storing process.

Figures 11, 12:
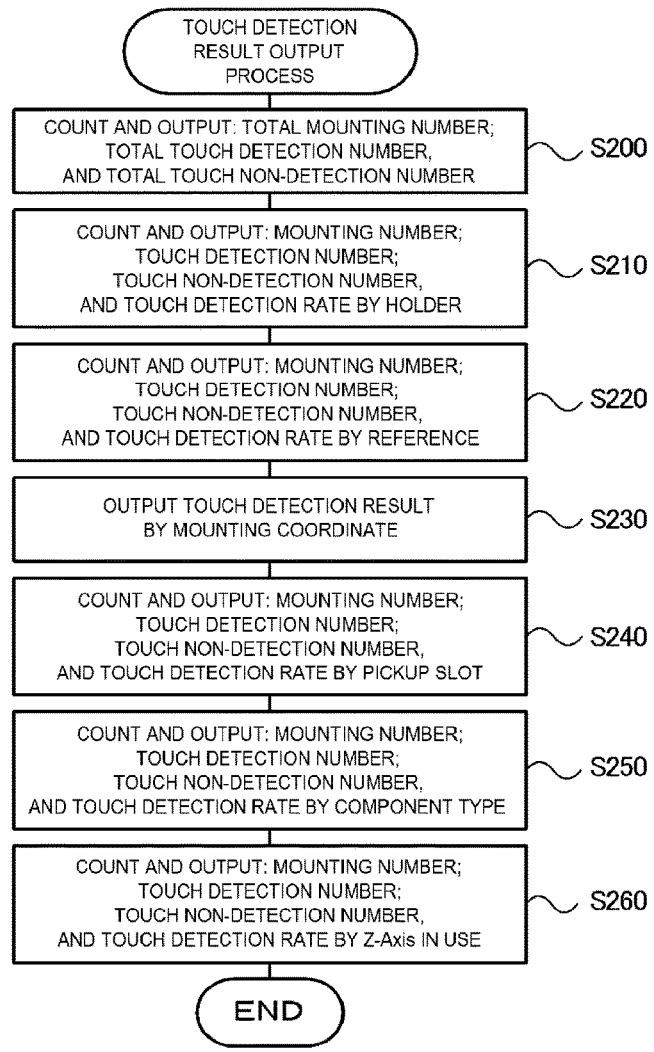
FIG. 11 is an explanatory diagram showing an example of detection result data by Z-axis in use.
FIG. 12 is a flowchart showing an example of touch detection result output process.

FIG. 6 is an explanatory diagram showing an example of total detection result data. FIG. 7 is an explanatory diagram showing an example of detection result data by holder. FIG. 8 is an explanatory diagram showing an example of detection result data by component reference. FIG. 9 is an explanatory diagram showing an example of detection result data by pickup slot. FIG. 10 is an explanatory diagram showing an example of detection result data by component type. FIG. 11 is an explanatory diagram showing an example of detection result data by Z-axis in use. These pieces of detection result data are all stored individually in HDD 93 for each of multiple component mounting devices 20 that make up the component mounting line. The detection result data by holder is such that a mounting number, a touch detection number, and a touch non-detection number are provided for each of multiple nozzle holders 42 possessed by head 40 and that when component P is mounted on that one board S, only the data corresponding to nozzle holder 42 of those multiple nozzle holders 42 that is actually used for the mounting is updated. The detection result data by component reference is such that a mounting number, a touch detection number, a touch non-detection number, and a mounting coordinate (a target mounting position) are provided for each of multiple components P that are to be mounted on one board S and that when component P is mounted, only the data corresponding to a component reference of that component P is updated. The detection result data by pickup slot is such that a mounting number, a touch detection number, and a touch non-detection number are provided for each of the multiple pickup slots (the feeder bases) that component mounting device 10 includes and that when component P is mounted, only the data corresponding to a pickup slot used for supply of that component P is updated. The detection result data by component type is such that a mounting number, a touch detection number, and a touch non-detection number are provided for each of multiple component types of multiple components P that are to be mounted on one board S and that when component P is mounted, only the data corresponding to a component type of that component P is updated. The detection result data by Z-axis in use is such that a mounting number, a touch detection number, and a touch non-detection number are provided for each of combinations of the Z-axis driving devices that are used both for picking up and mounting component P and that when component P is mounted, only the data corresponding to a combination of the Z-axis driving devices that is used both for picking up and mounting that component P is updated.

Figure 13:
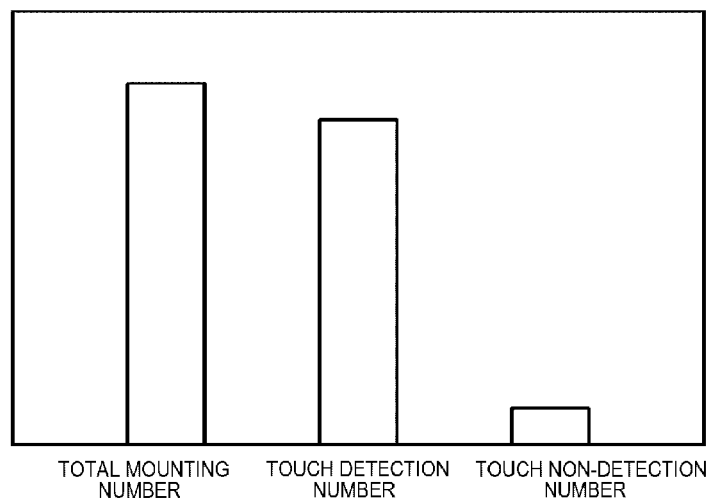
FIG. 13 is an explanatory diagram showing an example of a total detection result data output screen.

Next, an operation of outputting the detection result data stored in HDD 93 will be described. FIG. 12 is a flowchart showing an example of a touch detection result output process. This process is executed when the operator instructs an output of the touch detection result. In the touch detection result output process, CPU 91 of management device 90 first obtains a total mounting number, a total touch detection number, and a total touch non-detection number from the total detection result data, and outputs the numbers so obtained to display 98 in the form of a graph (step S200). FIG. 13 shows an example of a total detection result data output screen. The total detection result data output screen displays thereon the total mounting number, the total touch detection number, and the total touch non-detection number of the whole of component mounting device 10. The total detection result data is counted for each of component mounting devices 10 that make up the component mounting line. As a result, the operator can grasp degrees of occurrence of abnormality of individual component mounting devices 10 by watching the output screen displaying the detection result data by component mounting device 10.

Figure 14:
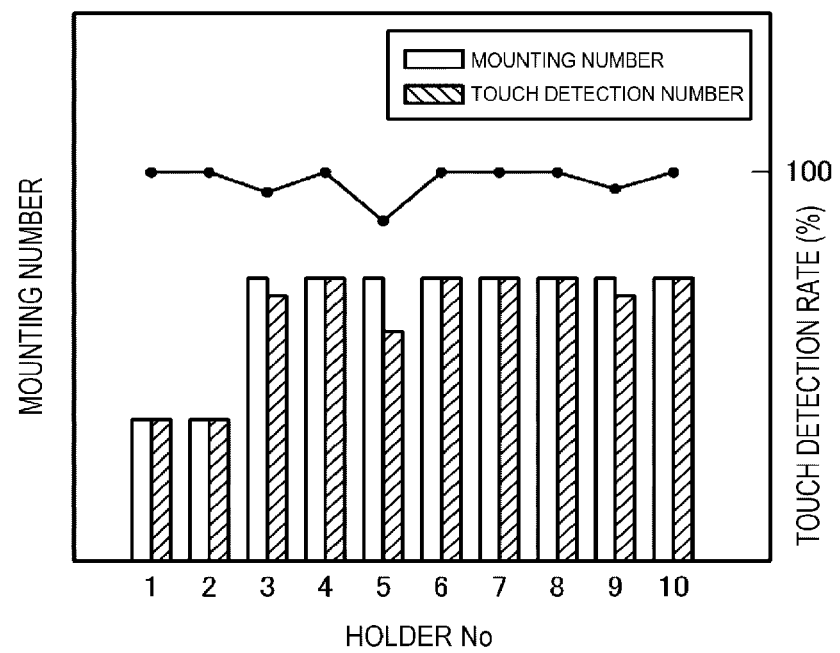
FIG. 14 is an explanatory diagram showing an example of a detection result data by holder output screen.

Next, CPU 91 obtains a mounting number and a touch detection number of each holder from the detection result data by holder, calculates a touch detection rate for each holder by dividing the touch detection number by the mounting number, counts mounting numbers, touch detection numbers, and touch detection rates of the holders, and outputs them to display 98 in the form of a graph (step S210). FIG. 14 shows an example of a detection result data by holder output screen. The detection result data by holder output screen displays thereon the mounting numbers, the touch detection numbers, and the touch detection rates of the holders that head 40 includes. As a result, the operator can grasp degrees of occurrence of abnormality of the individual holders by watching the detection result data by holder output screen. In the example shown in FIG. 14, the touch detection rate becomes low when a No. 5 holder is used. As a result, the operator can assume that abnormality is occurring in the No. 5 holder.

Figure 15:
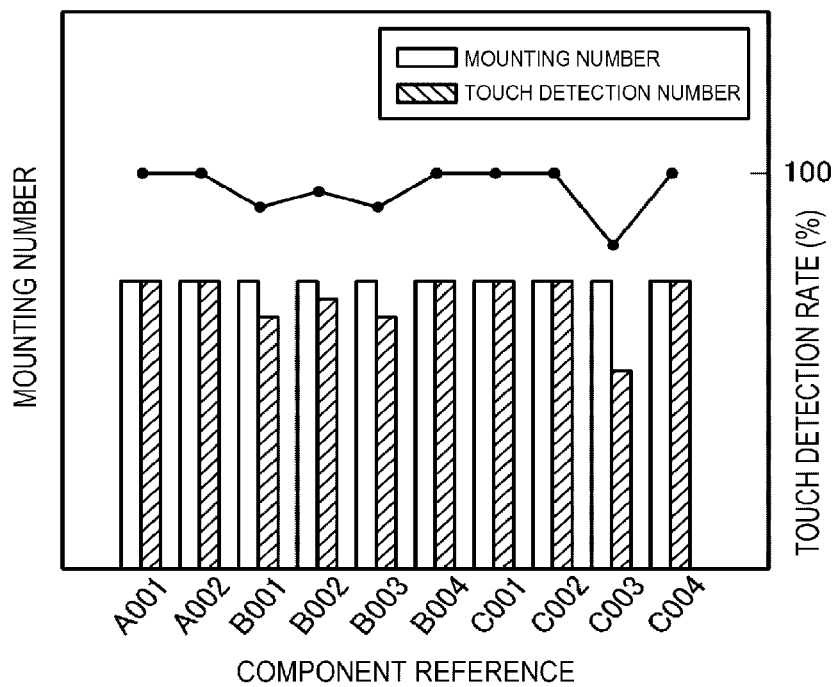
FIG. 15 is an explanatory diagram showing an example of a detection result data by component reference output screen.
Figure 16:
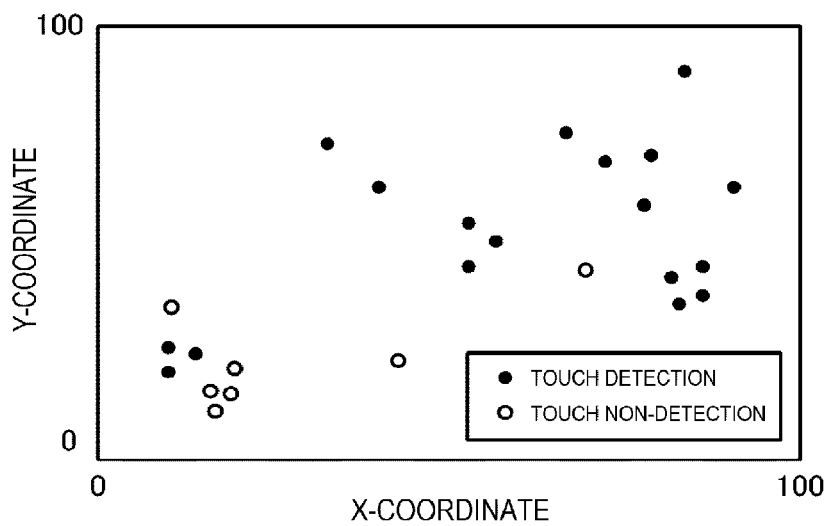
FIG. 16 is an explanatory diagram showing an example of a detection result data by mounting coordinate output screen.

In addition, CPU 91 obtains a mounting number and a touch detection number for each component reference from the detection result data by component reference, calculates a touch detection rate for each component reference by dividing the touch detection number by the mounting number, counts mounting numbers, touch detection numbers, and touch detection rates of the component references, and output them to display 98 in the form of a graph (step S220). Subsequently, CPU 91 obtains mounting coordinates included in the detection result data by component reference, sets a display area matching an external shape of board S on the screen of display 98, and displays information on touch detection and non-detection for each of the mounting coordinates within the display area on the screen of display 98 (step S230). FIG. 15 shows an example of a detection result data by component reference output screen. The detection result data by component reference output screen displays thereon mounting numbers, touch detection numbers and touch detection rates of the component reference. FIG. 16 shows an example of a detection result data by mounting coordinate output screen. In FIG. 16, black circular points indicate touch detection and denote that the touch non-detection number takes a value 0 at mounting coordinates of the black circular points. In addition, in FIG. 16, white circular points indicate touch non-detection and denote that the touch non-detection number takes a value 1 at mounting coordinates of the while circular points. The operator can grasp the coordinates of components mounted on board S where abnormality is occurring and degrees of occurrence of abnormality of the components where abnormality is occurring by watching the detection result data by component reference output screen and the detection result data by mounting coordinate output screen.

Figure 17:
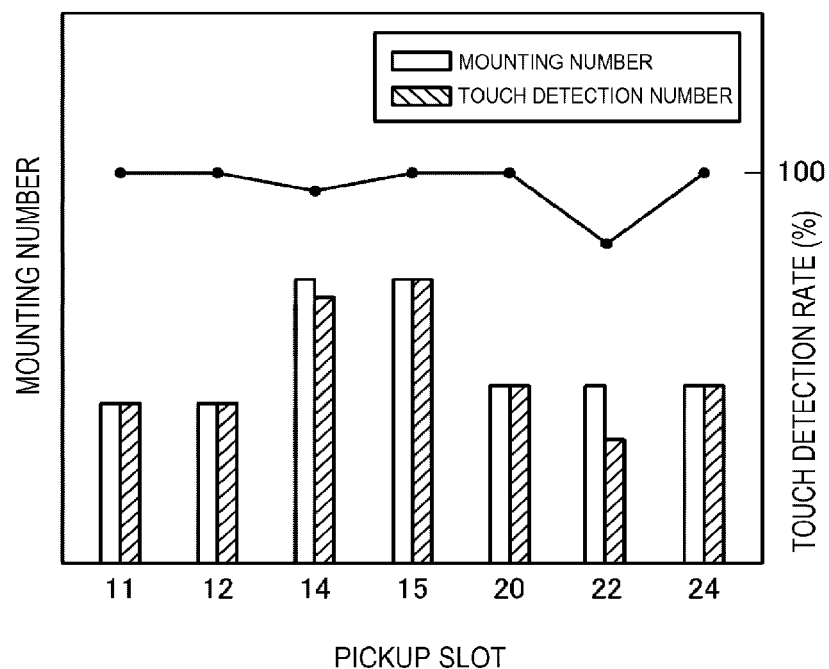
FIG. 17 is an explanatory diagram showing an example of a detection result data by pickup slot output screen.

Then, CPU 91 obtains a mounting number and a touch detection number of each of the pickup slots from the detection result data by pickup slot, calculates a touch detection rate of each of the pickup slots by dividing the touch detection number by the mounting number, counts mounting numbers, touch detection numbers, and touch detection rates of the pickup slots, and outputs them to display 98 in the form of a graph (step S240). FIG. 17 shows an example of a detection result data by pickup slot output screen. The detection result data by pickup slot output screen displays thereon the mounting numbers, the touch detection numbers and the touch detection rates of the pickup slots. As a result, the operator can grasp the pickup slot where component supply device 21 (the tape feeder) in which abnormality is occurring is mounted and a degree of occurrence of abnormality of that component supply device 21 by watching the detection result data by pickup slot output screen. In the example of FIG. 17, the touch detection rate becomes low when component P supplied from component supply device 21 mounted in the 22nd slot is picked up. As a result, the operator can assume that abnormality is occurring in component supply device 21 mounted in the 22nd slot or in component P accommodated in that component supply device 21.

Figure 18:
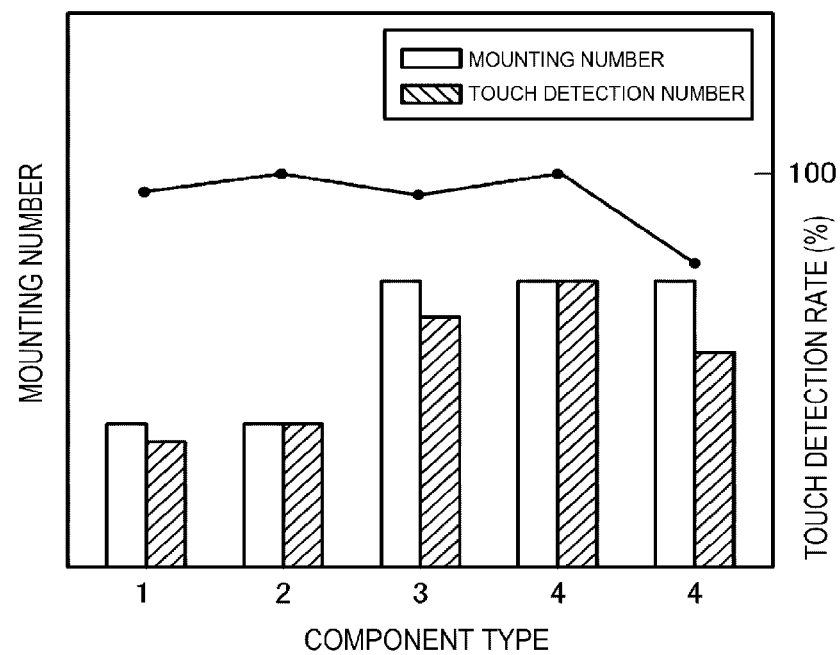
FIG. 18 is an explanatory diagram showing an example of a detection result data by component type output screen.

Next, CPU 91 obtains a mounting number and a touch detection number of each of the component types from the detection result data by component type, calculates a touch detection rate of each of the component types by dividing the touch detection number by the mounting number, counts mounting numbers, touch detection numbers and touch detection rates of the component types, and outputs them to display 98 in the form of a graph (step S250). FIG. 18 shows an example of a detection result data by component type output screen. The detection result data by component type output screen displays thereon the mounting numbers, the touch detection numbers, and the touch detection rates of the component types. The operator can grasp a component type in which abnormality is occurring and a degree of occurrence of abnormality of the component type by watching the detection result data by component type output screen.

Figure 19:
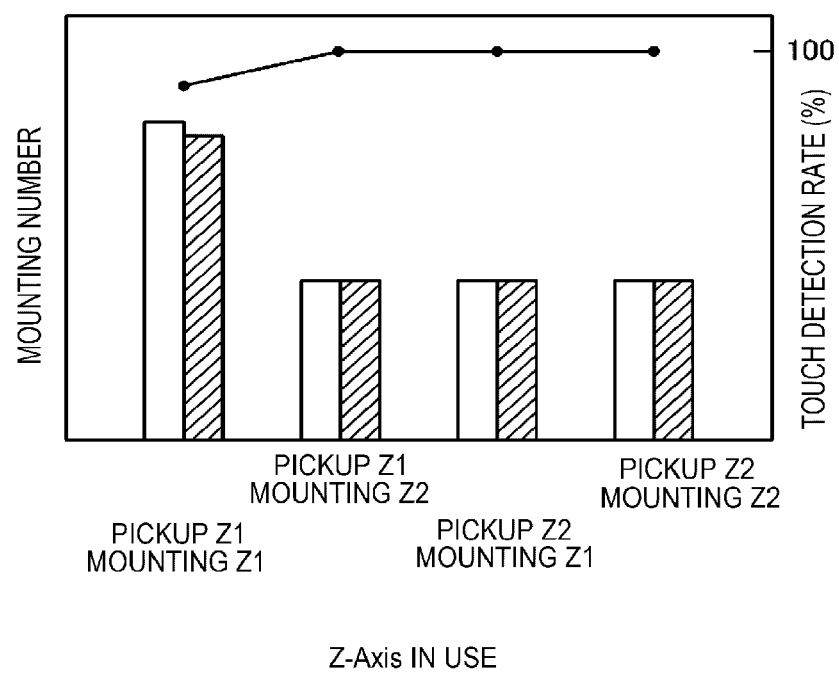
FIG. 19 is an explanatory diagram showing an example of a detection result data by Z-axis in use output screen.

Then, CPU 91 obtains a mounting number and a touch detection number of each of the Z-axes in use from the detection result data by Z-axis in use, calculates a touch detection rate of each of the component types by dividing the touch detection number by the mounting number, counts mounting numbers, touch detection numbers, and touch detection rates of the Z-axes in use, and outputs them to display 98 in the form of a graph (step S260). FIG. 19 shows an example of a detection result data by Z-axis in use output screen. The detection result data by Z-axis in use output screen displays thereon the mounting numbers, the touch detection numbers, and the touch detection rates of the Z-axis driving device of first and second Z-axis driving devices 70, 75 that is used in picking up a component and of the combinations (four combinations) of the Z-axis driving devices that are used in mounting a component. As a result, the operator can grasp the Z-axis driving device in which abnormality is occurring and a degree of occurrence of abnormality of that Z-axis driving device by watching the detection result data by Z-axis in use output screen.

Here, the correspondence between the main elements of the present embodiment and main elements of the present disclosure will be described. That is, XY moving device 30 corresponds to a moving device, suction nozzle 44 corresponds to a pickup member, CPU 91 and HDD 93 that execute the touch detection result storing process correspond to a storage device, and CPU 91 and display 98 that execute the touch detection result output process correspond to an output device. Component supply device 21 corresponds to a component supply device. Nozzle holder 42 corresponds to a holder, and head 40 corresponds to a head. In addition, head main body 41 corresponds to a rotating body, first Z-axis driving device 70 corresponds to a first lifting and lowering device, and second Z-axis driving device 75 corresponds to a second lifting and lowering device. Component mounting system 1 corresponds to a component mounting system.

The present disclosure is not limited to the embodiment that has been described heretofore at all, and needless to say, the present disclosure may be carried out in various modes without departing from the technical scope thereof.

For example, in the embodiment that has been described heretofore, the holder in use, the pickup slot, the component reference, the component type, and the Z-axis in use are described as being included as the mounting conditions when the detection results obtained by touch-down sensor 43 are stored in association with the mounting conditions when the detection results are obtained. However, the detection results only need to be stored in association with at least two mounting conditions.

In the embodiment that has been described heretofore, CPU 91 is described as causing the mounting numbers, the touch detection numbers, and the touch detection rates to be displayed on the detection result data output screen. However, CPU 91 may be configured to cause the touch non-detection numbers, in addition to the mounting numbers, the touch detection numbers, and the touch detection rates, to be so displayed. In addition, CPU 91 may omit from display any one or two in the mounting numbers, the touch detection numbers, the touch non-detection numbers, and the touch detection rates.

In the embodiment that has been described heretofore, XY moving device 30 is described as moving head 40 (suction nozzle 44) in the XY-directions. However, the XY moving device may be configured to move the board S in the XY-directions. That is, the XY moving device only needs to move the head relative to board S.

As has been described heretofore, according to the gist of a first aspect of the present disclosure, there is provided an analysis device for use for a component mounting device including a pickup member configured to be moved relative to a board by means of a moving device and a contact detection sensor configured to detect that a component picked up by the pickup member is brought into contact with the board to analyze a mounting state of the component mounting device, the analysis device including:

a storage device configured to store multiple detection result data relating to detection results obtained by the contact detection sensor when the component is mounted on the board in association with mounting conditions when the detection results are obtained by the contact detection sensor; and an output device configured to count the multiple detection result data stored in the storage device by at least two conditions in the mounting conditions and output the multiple detection result data so counted.

With the analysis device according to the first aspect of the present disclosure, the multiple detection result data relating to the detection results obtained by the contact detection sensor when the component is mounted on the board are stored in association with the mounting conditions when the detection data are obtained. Then, the analysis device counts the stored multiple detection data by the at least two conditions in the mounting conditions and outputs the detection result data so counted. As a result, the mounting states of the component mounting device can easily be analyzed based on the detection result data collected and combined by the at least two conditions. For example, when a component mounting failure occurs, the mounting states of the component mounting device can be analyzed to locate the mounting condition in which the component mounting failure occurs, thereby making it possible to improve the component mounting quality of the component mounting device by reflecting the results of the analysis to the mounting of a component by the component mounting device.

In the analysis device according to the first aspect of the present disclosure, the mounting condition may include at least one of information on a component supply device that supplies the component so mounted, information on a type of the component so mounted, information on a mounting position of the component so mounted, and information on a reference to the component so mounted. As a result, in a case that the detection result of the contact detection sensor is abnormal, it becomes easy to specify a cause for the abnormality.

In the analysis device according to the first aspect of the present disclosure, the component mounting device may include a head having multiple holders each configured to hold the pickup member, and the mounting condition may include information on a holder used in mounting the component. As a result, in a case that the detection result of the contact detection sensor is abnormal, it becomes easy to determine whether the holder constitutes a cause for the abnormality.

In the analysis device according to the first aspect of the present disclosure, the head may be a rotary head having a rotating body on which the multiple holders are arranged on the same circumference, a rotating device configured to rotate the rotating body in such a manner that the multiple holders revolve in a circumferential direction, a first lifting and lowering device configured to lift up and lower a holder of the multiple holders that is located in a first pivoting position, and a second lifting and lowering device configured to lift up and lower a holder of the multiple holders that is located in a second pivoting position that differs from the first pivoting position, and the mounting condition may include at least one of information on a lifting and lowering device used in mounting the component and information on a lifting and lowering device used in picking up the component. As a result, in a case that the detection result of the contact detection sensor is abnormal, it becomes easy to determine which of the first lifting and lowering device and the second lifting and lowering device constitutes a cause for the abnormality.

According to the gist of a second aspect of the present disclosure, there is provided an analysis device for use for a component mounting system including multiple component mounting devices each having a pickup member configured to be moved relative to a board by means of a moving device and a contact detection sensor configured to detect that a component picked up by the pickup member is brought into contact with the board to analyze a mounting state of each of the component mounting devices, the analysis device including a storage device configured to store multiple detection result data relating to detection results obtained by the contact detection sensor when the component is mounted on the board for each of the component mounting devices, and an output device configured to count the multiple detection result data stored in the storage device and output the multiple detection result data so counted for each of the component mounting devices.

With the analysis device according to the second aspect of the present disclosure, the multiple detection result data relating to the detection results obtained by the contact detection sensor when the component is mounted on the board are stored for each of the component mounting devices that make up the component mounting system. Then, the analysis device counts the multiple detection result data stored therein and outputs the detection results so counted for each of the component mounting devices. As a result, the mounting states of each of the component mounting devices can easily be analyzed based on the detection result data. For example, when a component mounting failure occurs, the mounting states of each of the component mounting devices can be analyzed to locate the component mounting device in which the component mounting failure occurs, thereby making it possible to improve the component mounting quality of the component mounting system by reflecting the results of the analysis to the mounting of a component by the component mounting device in which the component mounting failure occurs.

INDUSTRIAL APPLICABILITY

The present disclosure can be applied to a manufacturing industry of a component mounting device and an analysis device therefor.

REFERENCE SIGNS LIST 1 component mounting system, 2 screen printing device, 10 component mounting device, 11 base, 12 housing, 21 component supply device, 22 board conveyance device, 25 mark camera, 26 part camera, 30 XY moving device, 31 X-axis guide rail, 32 X-axis slider, 33 X-axis motor, 35 Y-axis guide rail, 36 Y-axis slider, 37 Y-axis motor, 40 head, 41 head main body, 42 nozzle holder, 43 touch-down sensor, 44 pickup nozzle, 45, 46 side camera, 50 R-axis driving device, 51 R-axis motor, 52 R-shaft, 53 transmission gear, 60 Q-axis driving device, 61 Q-axis motor, 62 cylindrical gear, 62a spur gear, 63 transmission gear 64 Q-axis gear, 70 first Z-axis driving device, 71, 76 Z-axis motor, 72, 77 Z-axis slider, 75 second Z-axis driving device, 80 control device, 81 CPU, 82 ROM, 83 HDD, 84 RAM, 85 input and output interface, 86 bus, 90 management device, 91 CPU, 92 ROM, 93 HDD, 94 RAM, 95 input and output interface, 97 input device, 98 display, P component, S board.

The invention claimed is:

1. A component mounting system, comprising:
a component mounting device, including
a pickup member configured to be moved relative to a board by a moving device,
a head including multiple holders each configured to hold the pickup member. and
a contact detection sensor configured to detect when a component picked up by the pickup member is brought into contact with the board by detecting a relative movement between the pickup member and a holder of the multiple holders; and
an analysis device to analyze a mounting state of the component mounting device, including
a storage device configured to store multiple detection result data relating to detection results obtained by the contact detection sensor when the component is mounted on the board in association with mounting conditions, and
an output device configured to count the multiple detection result data stored in the storage device by at least two conditions of the mounting conditions and output counted detection result data.

2. The component mounting system according to claim 1, wherein the mounting conditions include information on a component supply device that supplies the component so mounted, information on a type of the component so mounted, information on a mounting position of the component so mounted, and information on a reference to the component so mounted.

3. The component mounting system according to claim 1, wherein the mounting conditions include information on a holder used in mounting the component.

4. The component mounting system according to claim 3, wherein the head includes a rotary head including a rotating body on which the multiple holders are arranged on a same circumference, a rotating device configured to rotate the rotating body to revolve the multiple holders in a circumferential direction, a first lifting and lowering device configured to lift up and lower a first holder of the multiple holders that is located in a first pivoting position, and a second lifting and lowering device configured to lift up and lower a second holder of the multiple holders that is located in a second pivoting position that differs from the first pivoting position, and
wherein the mounting conditions include information on a lifting and lowering device used in mounting the component and information on a lifting and lowering device used in picking up the component.

5. The component mounting system according to claim 1, wherein the contact detection sensor is configured to detect when the component is pushed into the board.

6. The component mounting system according to claim 3, wherein the mounting conditions include a type of the component, a size of the component, reference information assigned to the component, identification information on the head, identification information of a holder, identification information on feeder bases, identification information on axis driving devices, target mounting positions, and a target mounting height.

7. A component mounting system, comprising:
a component mounting device, including
a pickup member configured to be moved relative to a board by a moving device,
a head including multiple holders each configured to hold the pickup member and
a contact detection sensor configured to detect when a component picked up by the pickup member is brought into contact with the board by detecting a relative movement between the pickup member and a holder of the multiple holders; and
circuitry configured to:
analyze a mounting state of the component mounting device,
store multiple detection result data relating to detection results obtained by the contact detection sensor when the component is mounted on the board in association with mounting conditions, and count the multiple detection result data by at least two conditions of the mounting conditions and output counted detection result data; and
a display configured to display the counted detection result data.

* * * * *